United States Patent
Satoh et al.

(10) Patent No.: US 10,529,390 B1
(45) Date of Patent: Jan. 7, 2020

(54) REDUCTION OF ZQ CALIBRATION TIME

(71) Applicant: Micron Technology, Inc., Boise, ID (US)

(72) Inventors: Yasuo Satoh, Tsukuba (JP); Yuan He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/205,450

(22) Filed: Nov. 30, 2018

(51) Int. Cl.
*G11C 7/10* (2006.01)
*G06F 3/06* (2006.01)

(52) U.S. Cl.
CPC .......... *G11C 7/1048* (2013.01); *G06F 3/0604* (2013.01); *G06F 3/0632* (2013.01); *G06F 3/0673* (2013.01); *G11C 2207/2254* (2013.01)

(58) Field of Classification Search
CPC .......... G11C 7/1048; G11C 2207/2254; G06F 3/0604; G06F 3/0673; G06F 3/0632
USPC .......................................................... 326/30
See application file for complete search history.

(56) References Cited

U.S. PATENT DOCUMENTS

| | | | |
|---|---|---|---|
| 9,324,410 B2 | 4/2016 | Arai | |
| 9,665,462 B2 | 5/2017 | Tatapudi et al. | |
| 2005/0226080 A1 | 10/2005 | Lee | |
| 2015/0067292 A1* | 3/2015 | Grunzke | G06F 13/1694 711/170 |
| 2017/0351451 A1 | 12/2017 | Gans | |
| 2018/0114586 A1 | 4/2018 | Jang et al. | |
| 2018/0158495 A1* | 6/2018 | Jeon | G11C 7/1057 |
| 2018/0286467 A1 | 10/2018 | Arai et al. | |
| 2019/0052268 A1* | 2/2019 | Lee | H03K 19/0005 |
| 2019/0131972 A1* | 5/2019 | Gans | H03K 19/01858 |

OTHER PUBLICATIONS

International application No. PCT/US2019/041002—International Search Report and Written Opinion, dated Oct. 25, 2019, 13 pages.

* cited by examiner

*Primary Examiner* — Don P Le
(74) *Attorney, Agent, or Firm* — Perkins Coie LLP

(57) ABSTRACT

A memory system includes an external calibration device that has a predetermined impedance and a first memory device with a first pad for selective connection to the external calibration device. The first memory device also includes an internal calibration device having an impedance that is programmable and a second pad connected to the internal calibration device. The system further includes a second memory device having a third pad for selective connection to the second pad of the first memory device. A processing device is operatively coupled to the first memory device and the second memory device. The processing device programs the impedance of the internal calibration device of the first memory device based on the external calibration device, and programs an impedance of a termination component in the second memory device based on the impedance of the internal calibration device of the first memory device.

24 Claims, 10 Drawing Sheets

REDUCTION OF ZQ CALIBRATION TIME

TECHNICAL FIELD

The present disclosure is directed to systems and methods for ZQ calibration in memory systems, and more particularity to reducing ZQ calibration times by use of parallel measurement processing.

BACKGROUND

Semiconductor systems, such as semiconductor memory and processors, transmit data across data communication lines that are configured to have carefully matched impedance values. Variations in certain operating parameters such as temperature or the like can result in impedance mismatches that can adversely affect data transmission rates and quality. In order to mitigate these adverse scenarios, the semiconductor systems can include termination components that have programmable impedances, which can be adjusted based on a calibration process as operating conditions change. In some implementations, the impedances of the termination components are programmed based on voltage measurements made on a connection pad attached to an external connection (also referred to herein as an "external pin" or "pin") of a semiconductor memory package. The external pin can connect to an external reference calibration device such as, for example, a resistor. However, the number of external pins that are available on the typical semiconductor memory package is limited and, typically, only one external reference calibration device per memory package is provided. In a case where the semiconductor system is a memory such as a SRAM or DRAM, the memory system can include a memory package that has multiple semiconductor components (e.g., semiconductor dies) that each contains one or more memory devices, which contain the memory cells and the termination components. In such memory systems, each memory device must share the external reference calibration device via the external pin when programming the respective termination component based on the results of the calibration process. However, as the number of memory devices that share the external reference calibration device increases, the calibration times for the memory systems can get very long.

DETAILED DESCRIPTION

The present disclosure is directed to a memory system that includes multiple memory devices. The memory system can also include a connection pad (also referred to herein as "ZQ pad") coupled in common to the multiple memory devices. The ZQ pad can be connected to an external reference calibration device having a fixed predetermined impedance. The multiple memory devices can include first memory devices that use the external reference calibration device to calibrate connection terminals and an internal reference calibration device in the respective first memory devices. The multiple memory devices can also include second memory devices that use respective internal reference calibration devices in the first memory devices to calibrate connection terminals in the corresponding second memory devices.

Figure 1:
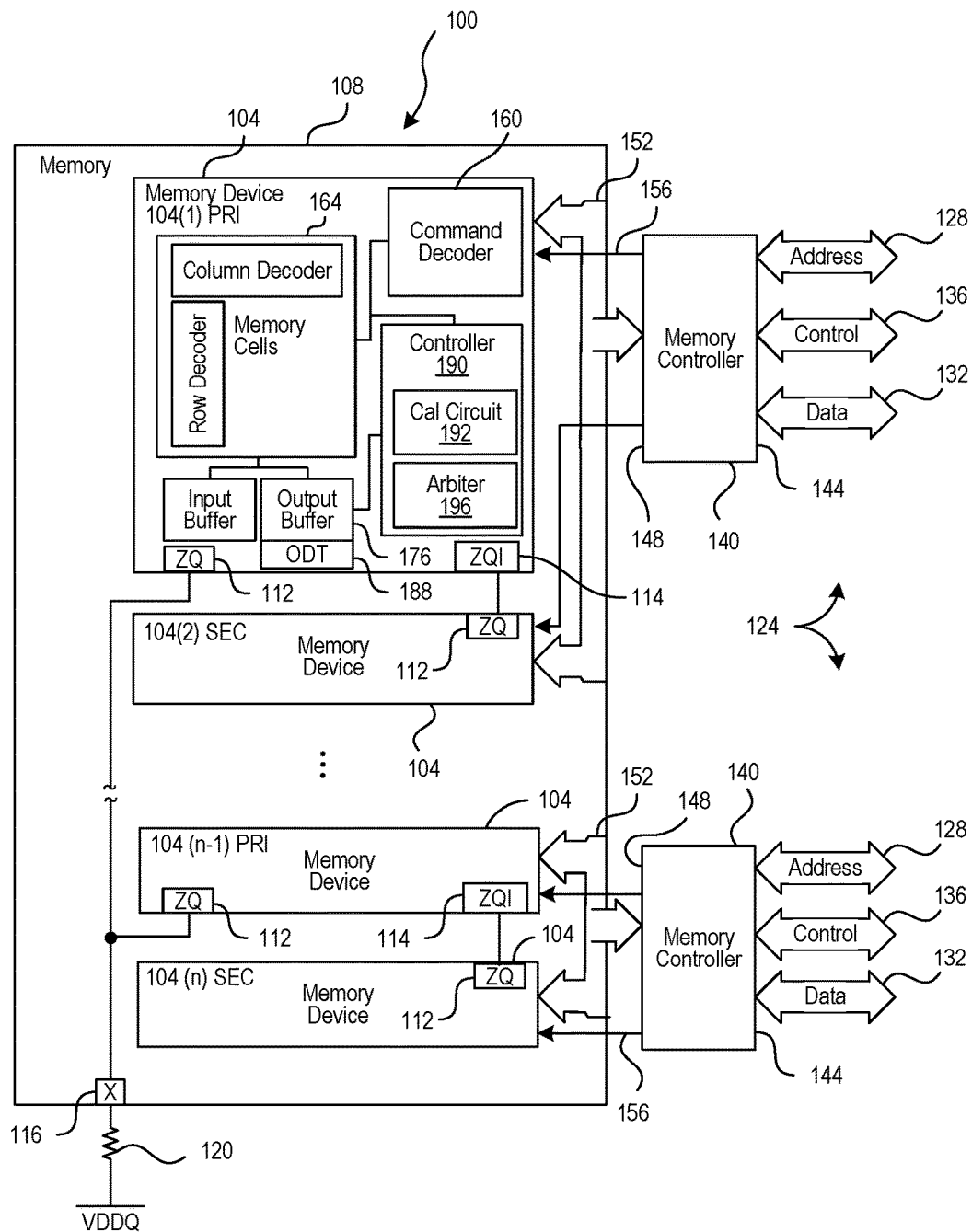
FIG. 1 is block diagram of an embodiment of a memory system in accordance with the present disclosure.

FIG. 1 is block diagram of a memory system in accordance with the present technology. Referring to FIG. 1, the memory system of the present disclosure will be described with reference to a memory system 100, by way of example and not limitation. The memory system 100 may be a volatile memory such as a SRAM or DRAM, or a nonvolatile memory such as a FLASH memory or a ferroelectric memory. In one embodiment, the memory system 100 may be a Double Data Rate (DDR) memory, such as a Low Power Double Data Rate 4 (LPDDR4) or Low Power Double Rate 5 (LPDDR5 or LP5) memory. The memory system 100 can be arranged as a component of a computing device such as a laptop computer, a desktop computer, a cellular or other mobile device, a table computer, personal digital assistant, and so on. The memory system 100 can be mounted in an appropriate memory slot or otherwise interconnected with the computing device such that communication can take place through the pins on the package 108 (i.e., memory module) of the memory system 100. A computing device that includes the memory system 100 may generally include one or more processors (not shown in FIG. 1). The processor or processors can be single core or multi-core in various implementations. Typically, the memory system 100 functions as a passive device in the larger system, receiving and executing commands received from a processor or processor core. Here, the computing device may include a bus interface 124 across which the memory system 100 and the processor or processor cores can communicate. As shown in FIG. 1, the bus interface 124 can include an address bus 128, a data bus 132, and a command bus 136. FIG. 1 shows these various buses as separate components by way of example and not limitation. In some instances, the bus interface 124 can multiplex two or more of these separate buses. For example, in some implementations, the address bus 128 and the command bus 136 can be time division multiplexed such that these buses use the same physical lines in different time slices.

The memory system 100 can be associated with one or more memory controllers 140 that are configured to provide data communication to and from the memory system 100. The memory controller 140 can include a front end 144 that communicates across the bus interface 124. Similarly, the memory controller 140 can include a back end 148 that communicates with the memory system 100. Each memory controller 140 can communicate across a separate memory bus 152 that couples the back end 148 of the memory controller 140 to one or more of the memory devices 104 that are associated with the memory system 100. Each memory bus 152 associated with a given controller 140 can include address, data, and control lines that are coupled in common between the various memory devices 104 with which the controller 140 communicates. Each memory bus 152 can additionally include individual chip select lines 156 that can be selectively asserted to enable one of the memory devices 104 to send or receive data across the common address, data, and control lines. Through the combination of individual chip select lines 156 and common address, data, and control lines, a memory bus 152 associated with a given controller 140 provides separate communication pathways between the controller and each of the various memory devices 104 with which the controller 140 communicates.

In accordance with various embodiments, the memory system 100 can include multiple memory devices 104 that can be arranged on one or more semiconductor components such as, for example, semiconductor dies. In some embodiments, each memory device 104 can correspond to a semiconductor component such as, for example, a semiconductor die. However, in other embodiments, multiple memory devices 104 can be installed on the semiconductor component. The package 108 of the memory system 100 can contain and interconnect the semiconductor components, including the memory devices 104. The package 108 can provide multiple external pins that couple to contact pads arranged on an interior of the package 108. The pins and pads can provide electrical coupling such as between the memory devices 104 and the larger system to which the memory system 100 is coupled, as discussed above. In addition, the pins and pads can provide electrical connections to other components. For example, a ZQ pad and corresponding pin can connect to an external reference calibration device such as, for example, a resistor.

In operation, a processor or processor core sends a command to the memory system 100 by first sending the command across the bus interface 124. A memory controller 140 receives the command from across the bus interface 124 and routes the command to the appropriate memory device 104 on the memory system 100. Here, the memory controller 140 asserts the appropriate chip select line 156 and sends the command across the common address, data, and control lines of the memory bus 152. The appropriate memory device 104 receives the command from the memory controller 140 and initially processes the command through the operation of a command decoder 160. The command decoder 160 can be configured to recognize a plurality of commands that correspond to various operations that may be executed by the memory device 104. In the following discussion, a calibration command is described in order to more particularly illustrate certain embodiments of the present disclosure. It should be appreciated, however, that the command decoder 160 is generally configured to recognize and decode a number of commands that are not specifically discussed herein such as, for example read/write commands sent to memory array 164. Discussion of those various commands and illustration in the drawings of specific components related to those commands are omitted for the sake of clarity and brevity.

In some embodiments, a calibration command can instruct the controller 190 of the memory device 104 to calibrate an impedance of each termination of termination component 188. In some embodiments, the termination component can be an On-Die Termination (ODT) circuit. As known, an ODT circuit can be adjusted to provide a matched impedance with respect to a connected data bus. In FIG. 1, the termination component 188 is depicted independently of the output buffer 176. However, it is also possible that the output buffer includes the termination component 188 as a part of the output buffer. In such cases, the ODT operation is performed by at least a part of the output buffer. For clarity, exemplary embodiments of the disclosure will be discussed with respect to termination component 188. However, those skilled in the art will recognize that the description is also applicable to cases in which the termination component 188 is part of the output buffer 176.

Upon receipt, the command decoder 160 routes the calibration command to the controller 190, which can be configured to adjust impedances of the terminations in the termination component 188 based on a calibration procedure initiated by the calibration command. Calibration of the impedances of the terminations in the termination component 188 may be needed because the impedances of the terminations can vary due to a change in the operating conditions such as, for example, temperature changes that occur during the operation of the memory system 100. In some embodiments, each termination of the termination component 188 can include a group of pull-up and pull-down transistors that are controlled (e.g., enabled (ON) or disabled (OFF)) by the controller 190. The controller 190 enables/disables the pull-up and pull-down transistors based on a pull-up code signal and a pull-down code signal, respectively, so that the impedance of the termination component 188 and thus the output buffer 176 matches the impedance of the connected data bus. In this way, signal reflections that result from impedance mismatches are avoided.

Figure 2:
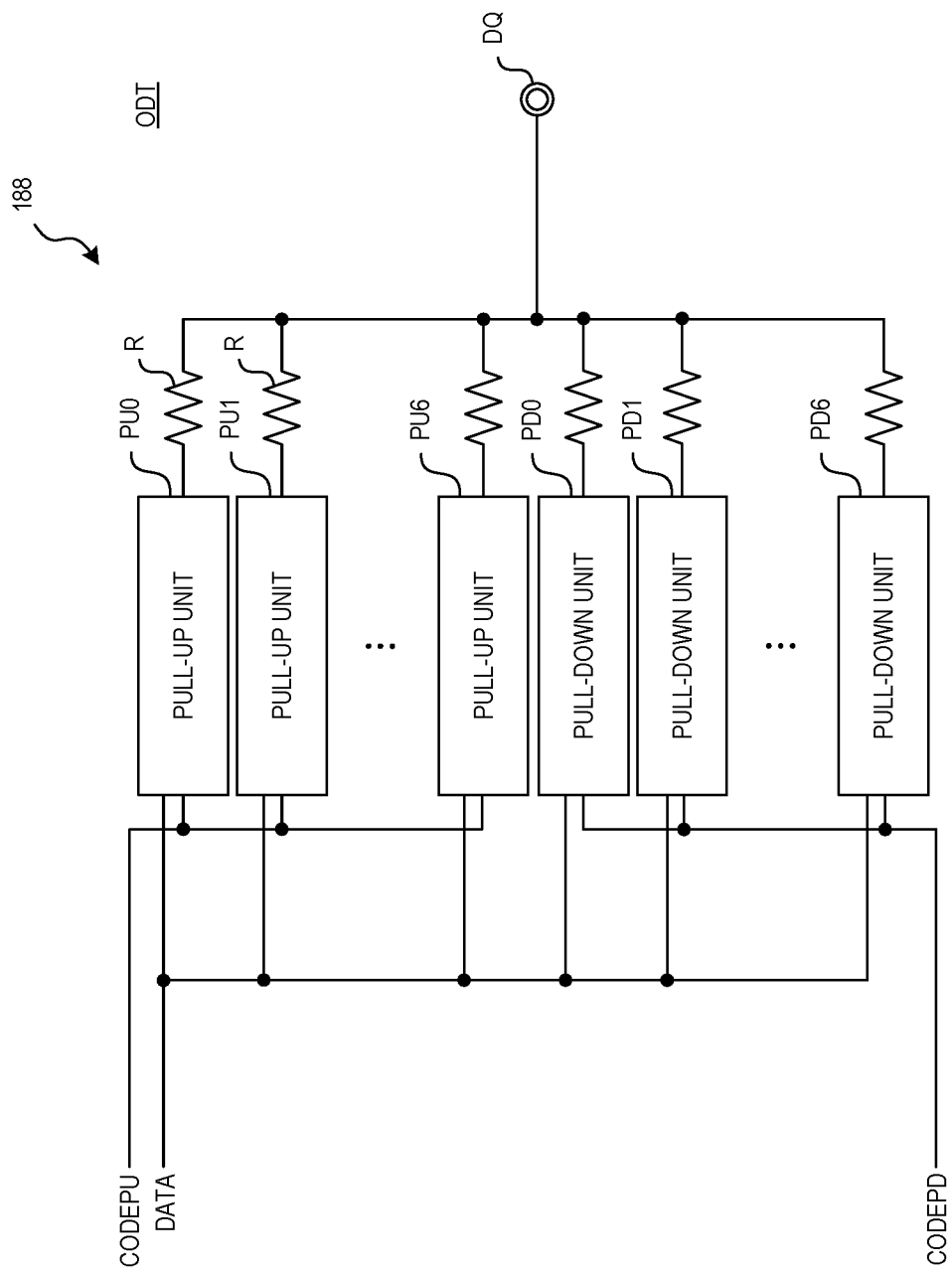
FIG. 2 is a block diagram of an embodiment of a termination component in accordance with the present disclosure.

The termination component 188 can include one or more pairs of pull-up units and pull-down units for each data input/output terminal. For example, in the illustrated embodiment of FIG. 2, the termination component 188 includes seven pull-up units PU0 to PU6 and seven pull-down units PD0 to PD6 for one data input/output terminal (or data bit) DQ. Each of the pull-up units PU0 to PU6 have the same circuit configuration, which includes a group of pull-up transistors, as known in the art. Similarly, each of the pull-down units PD0 to PD6 have the same circuit configuration, which includes a group of pull-down transistors, as known in the art. The output nodes of the pull-up units PU0 to PU6 and pull-down units PD0 to PD6 can be connected in common to a corresponding data input/output terminal DQ via resistors R.

Figure 3A:
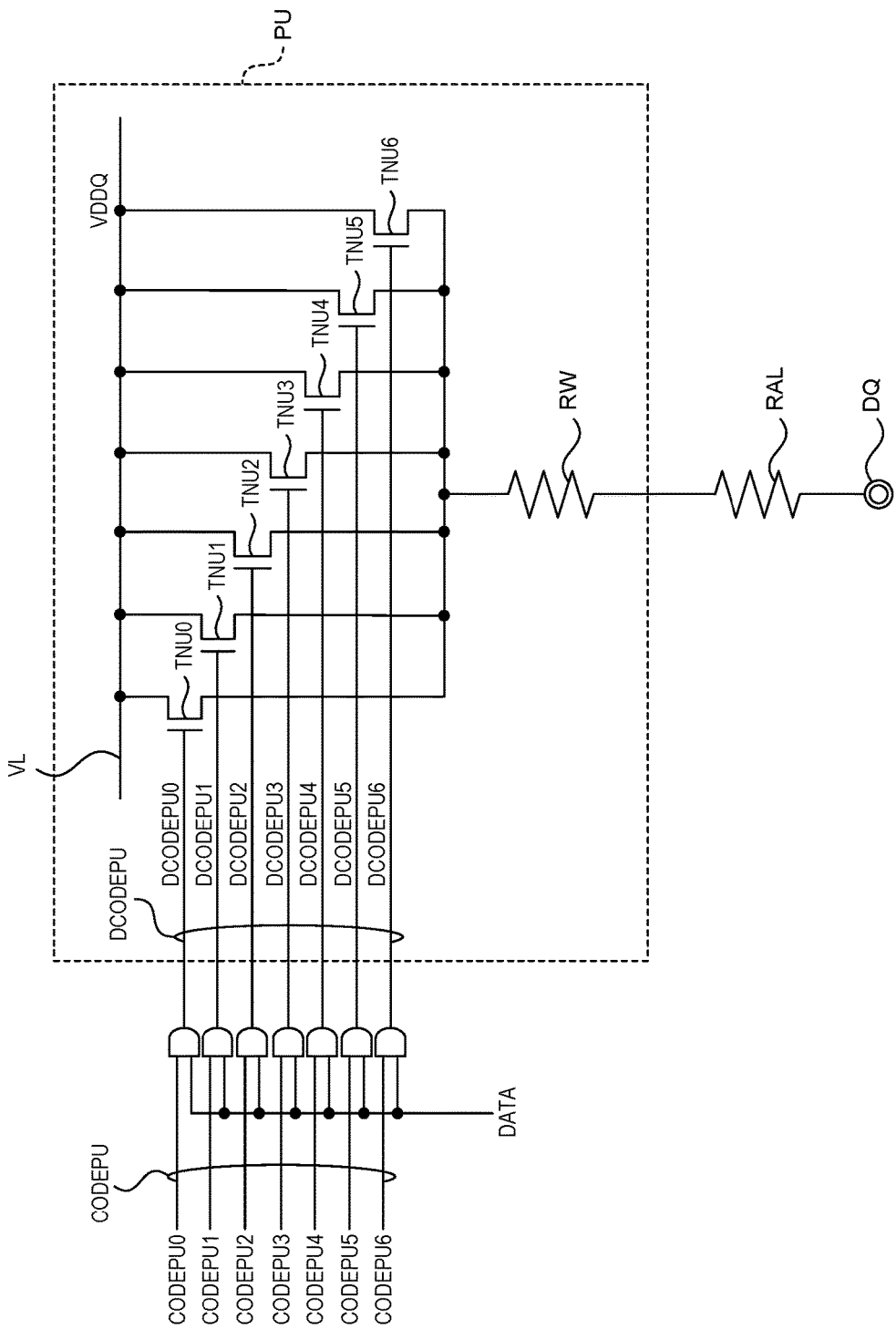
FIG. 3A is a schematic of an embodiment of a pull-up unit in accordance with the present disclosure.
Figure 3B:
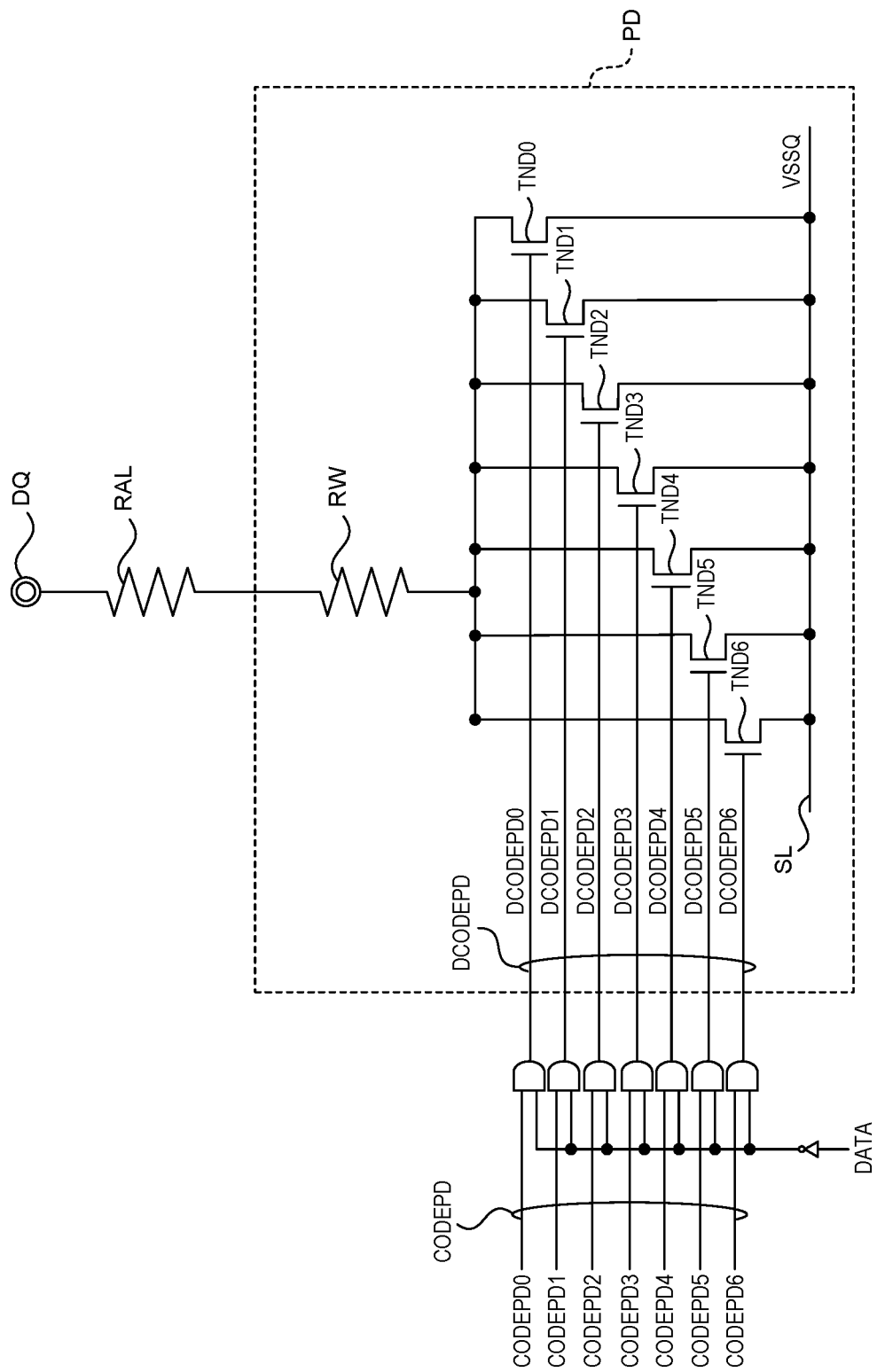
FIG. 3B is a schematic of an embodiment of a pull-down unit in accordance with the present disclosure.

FIGS. 3A and 3B illustrate exemplary embodiments of pull-up and pull-down unit circuits, respectively. Turning to FIG. 3A, the pull-up unit PU includes seven N-channel MOS transistors TNU0 to TNU6 (which are connected in parallel), and resistors RW and RAL. Alternatively, the pull-up unit PU can include P-channel MOS transistors. The drains of the transistors TNU0 to TNU6 can be connected in common to a power supply line VL, which supplies the power supply potential VDDQ. The sources of the transistors TNU0 to TNU6 can be connected to the data input/output terminals DQ via the resistors RW and RAL. The resistor RW can be made of tungsten wire or the like, and can be about 120 ohms, for example. The resistor RAL can be made of aluminum wire, or the like, and can be a small resistor that is less than or equal to 1 ohm, for example.

The bits DCODEPU0 to DCODEPU6 of the code control signal DCODEPU are respectively supplied to the gate electrodes of the transistors TNU0 to TNU6. Accordingly, the seven transistors TNU0 to TNU6 can be controlled based on the value of the code control signal DCODEPU in such a way as to be selectively turned ON or OFF. As shown in FIG. 3A, the code control signal DCODEPU is generated by logically combining, by using an AND gate circuit, each bit of a code signal CODEPU and an internal data bit DATA. When the internal data bit DATA is at a low level, all the bits DCODEPU0 to DCODEPU6 of the code control signal DCODEPU are at a low level regardless of the value of the code signal CODEPU. As a result, all the transistors TNU0 to TNU6 are set to OFF. When the internal data bit DATA is at a high level, the value of the code control signal DCODEPU is the same as the value of the code signal CODEPU. As a result, the transistors TNU0 to TNU6 are selectively turned ON or OFF based on the individual bit values of the code control signal DCODEPU. The impedance of the pull-up unit PU and thus the data input/output terminal DQ can be adjusted according to the value of the code signal CODEPU.

Turning to FIG. 3B, the pull-down unit PD includes seven N-channel MOS transistors TND0 to TND6 (which are connected in parallel), and resistors RW and RAL. The sources of the transistors TND0 to TND6 can be connected in common to a power supply line SL, which supplies ground potential VSSQ. The drains of the transistors TND0 to TND6 can be connected to the data input/output terminals DQ via the resistors RW and RAL.

The bits DCODEPD0 to DCODEPD6 of the code control signal DCODEPD are respectively supplied to the gate electrodes of the transistors TND0 to TND6. Therefore, the seven transistors TND0 to TND6 can be controlled based on the value of the code control signal DCODEPD in such a way as to be selectively turned ON or OFF. As shown in FIG. 3B, the code control signal DCODEPD is generated by logically combining, by using an AND gate circuit, each bit of a code signal CODEPD and an inverted internal data bit DATA. When the internal data bit DATA is at a high level, all the bits DCODEPD0 to DCODEPD6 of the code control signal DCODEPD are at a low level regardless of the value of the code signal CODEPD. As a result, all the transistors TND0 to TND6 are set to OFF. When the internal data bit DATA is at a low level, the value of the code control signal DCODEPD is the same as the value of the code signal CODEPD. As a result, the transistors TND0 to TND6 are selectively ON or OFF based on the individual bit values of the code control signal DCODEPD. Similar to the pull-up unit, the impedance of the pull-down unit PD and thus the data input/output terminal DQ can be adjusted according to the value of the code signal CODEPD. Those skilled in the art understand the paired configuration and operation of pull-up and pull-down units in the termination component 188 and thus, for brevity, the configuration and operation of the pull-up and pull-down units will not be further discussed.

Turning to FIG. 1, in some embodiments, the calibration circuit 192 sets (or calibrates) the impedance value of each termination in the termination component 188 based on an impedance measurement of a reference calibration device having a known impedance. For example, as shown in FIG. 1, the package 108 of the memory system 100 can include an external pin 116 (also referred to herein as the ZQ pin 116) that is coupled to a reference calibration device having a known impedance. In the illustrated exemplary embodiment, the reference calibration device can be a resistor 120 (also referred to herein as ZQ resistor 120) having a known impedance value RZQ (e.g., resistance). In some embodiments, the value of RZQ can be, for example 240 ohms±1%. Code signals CODEPU and CODEPD can be generated by the calibration circuit 192 based on an impedance measurement of ZQ resistor 120. Because ZQ resistor 120 is located external to the package 108, the impedance of ZQ resistor 120 is generally stable regardless of the operating conditions such as, for example, the temperature of the memory devices 104. The ZQ resistance 120 is coupled to one or more memory devices 104 via ZQ pad 112 in the respective memory devices 104.

In exemplary embodiments of the technology, the impedance target value corresponding to the code signal CODEPU for the pull-up units PU0 to PU6 is twice the value of ZQ resistor 120 and can be, for example, 2RZQ. The impedance target value corresponding to the code signal CODEPD for the pull-down units PD0 to PD6 is the value of ZQ resistor 120 and can be, for example, RZQ. Of course, the target impedance values of 2RZQ and RZQ for the pull-up and pull-down units, respectively, are not limiting and other embodiments can have different target impedances for either or both of the pull-up and pull-down units. In some embodiments, one or more of the memory devices 104 can use ZQ resistor 120 in an impedance calibration process, which is described in greater detail below.

In some embodiments, as part of the calibration command for calibrating the impedances of termination component 188, a known current generated by the calibration circuit 192 is passed through the ZQ resistor 120 via ZQ pin 116, and a voltage corresponding to the impedance of ZQ resistor 120 is measured at the ZQ pad 112. The impedance of the ZQ resistor 120 represents the impedance that each termination of the termination component 188 sees on the data bus to which it is coupled. The calibration circuit 192 takes the measured voltage at the ZQ pad 112 and compares the voltage to an internal reference voltage that corresponds to the desired impedance for each termination in the termination component 188. The result of the comparison can then be used to adjust calibration circuitry to step up or step down the voltage at the ZQ pad 112 so as to bring the ZQ pin 116 voltage closer to the reference voltage. The comparison process generates code signals CODEPU and CODEPD that can be used to enable/disable the various pull up and pull down transistors associated with the termination component 188 (also described herein as programming the termination component) to adjust their impedances so as to match that of the connected data bus.

Figure 4A:
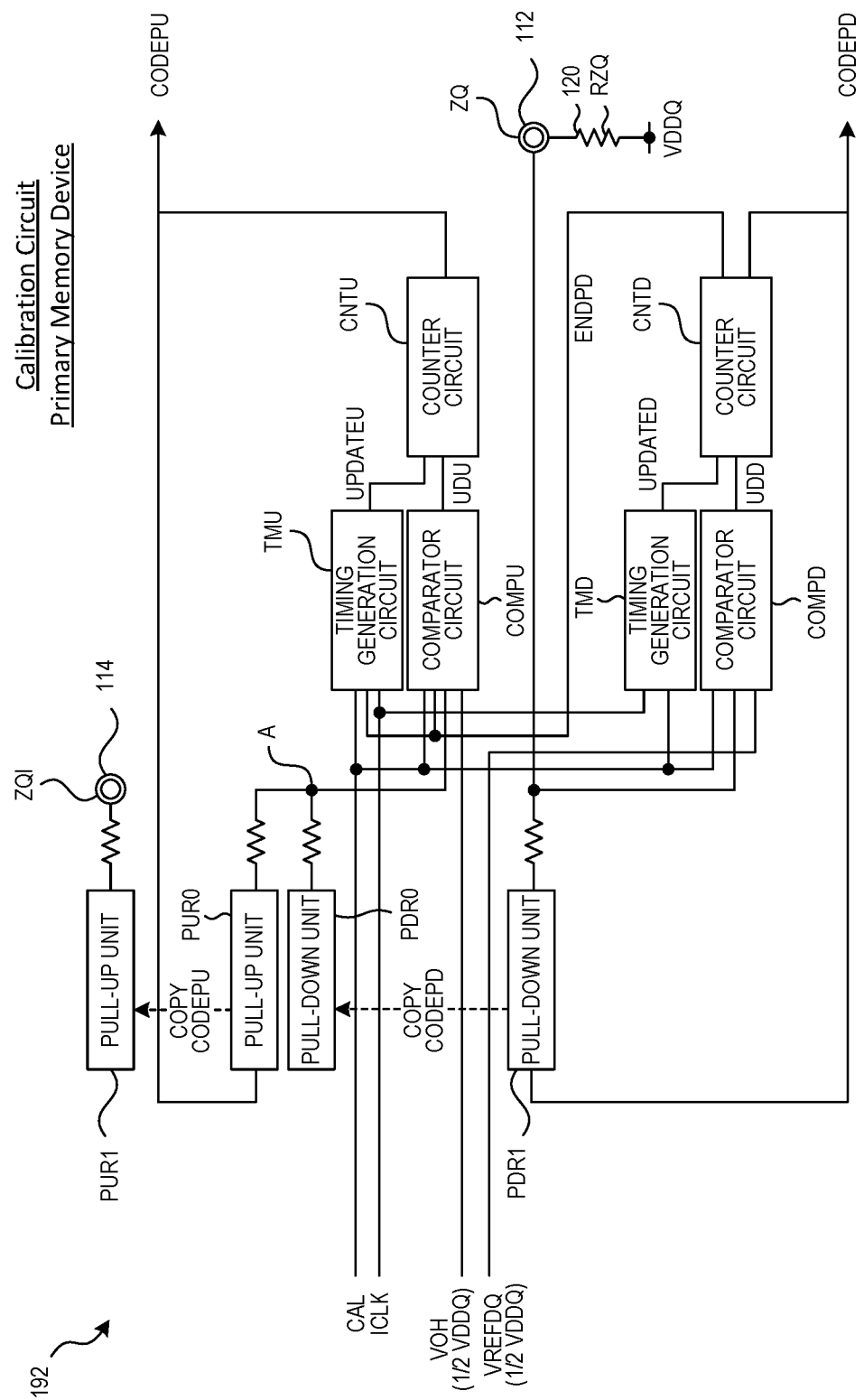
FIG. 4A is a schematic of an embodiment of a calibration circuit for a primary memory device in accordance with the present disclosure.

FIG. 4A illustrates an exemplary embodiment of a calibration circuit 192 that can generate the code signals CODEPU and CODEPD used to program the terminations in termination component 188 of the respective memory devices 104. As shown in FIG. 4A, the output node of the pull-down unit PDR1 is connected to external ZQ resistor 120, via the ZQ pad 112, and to a comparator circuit COMPD. The comparator circuit COMPD compares, in response to the activation of the calibration command signal CAL, the potential at ZQ pad 112 with the reference potential VREFDQ and generates an up-down signal UDD based on the result thereof. The value of reference potential VREFDQ is set to a value that will give the desired impedance for the pull-down unit. In this case, a reference potential VREFDQ of ½ VDDQ is used in order to get a desired impedance of RZQ for the pull-down units PD0-PD6 in the termination component 188. The up-down signal UDD is supplied to a counter circuit CNTD, and a code signal CODEPD (which is a multi-bit count value of the counter circuit CNTD) is stepped up or down based on the up-down signal UDD. The stepping-up or stepping-down of the counter circuit CNTD is performed in synchronization with an update signal UPDATED. The update signal UPDATED is generated by a timing generation circuit TMD in synchronization with the internal clock signal ICLK if the calibration signal CAL is activated. The comparator circuit COMPD performs the comparison between the potential at the ZQ pad 112 and the reference potential VREFDQ until the potential at the ZQ pad 112 and the reference potential VREFDQ are within a predetermined value and/or the counter circuit CNTD enters a dither condition (e.g., an oscillation between up and down on the up-down signal UDD). Once the comparison result is within a predetermined value and/or a dither condition is reached, the counter circuit CNTD can generate a signal ENDPD to indicate that the code signal CODEPD is at a calibrated value (also referred to herein as a "calibrated code signal CODEPD"). That is, the code signal CODEPD is at a value that will program the pull-down units in termination component 188 to an impedance that matches the connected data bus. The counter circuit CNTD maintains the calibrated code signal CODEPD value until the next calibration cycle.

To calibrate the code signal CODEPU, exemplary embodiments of the present technology can use a pull-down unit that has been programmed with the calibrated code signal CODEPD. As shown in FIG. 4A, after programming the pull-down unit PDR1, the calibrated code signal CODEPD is copied to the pull-down unit PDR0. Of course, the counter circuit CNTD can also update the pull-down unit PDR0 with an intermediate code signal CODEPD during the calibration process at the same time the updates are sent to the pull-down unit PDR1. Based on the calibrated code signal CODEPD, the appropriate transistors in pull-down unit PDR0 are turned ON or OFF (programmed) to set (or calibrate) the impedance, which in this case is RZQ. The pull-down unit PDR0 programmed with the desired impedance can then be used to determine the calibrated code signal CODEPU.

As shown in FIG. 4A, the pull-up unit PUR0 and pull-down unit PDR0 are connected at a common connection point A via respective resistors. The connection point A is connected to a comparator circuit COMPU that compares, in response to the activation of the calibration signal CAL, the potential of the connection point A with the reference potential VOH and generates an up-down signal UDU based on the result thereof. The up-down signal UDU is supplied to a counter circuit CNTU, and a code signal CODEPU, which is a count value of the counter circuit CNTU, is stepped up or stepped down based on the up-down signal UDU. The stepping-up or stepping-down of the counter circuit CNTU is performed in synchronization with an update signal UPDATEU. The update signal UPDATEU is generated by a timing generation circuit TMU in synchronization with the internal clock signal ICLK if the calibration signal CAL and an end signal ENDPD are activated. The comparator circuit COMPU performs the comparison between the potential at point A and the reference potential VOH until the potential of point A and the reference potential VOH are within a predetermined value and/or the counter circuit CNTU enters a dither condition (e.g., an oscillation between up and down on the up-down signal UDU). In the exemplary embodiment of FIG. 4A, the reference potential VOH can be ½ VDDQ. Once the comparison result is within a predetermined value and/or a dither condition is reached, the counter circuit CNTU maintains the last code signal CODEPU as the calibrated code signal CODEPU, and the calibrated code signal CODEPU is used to program the pull-up transistors associated with the termination component 188. In this case, the impedance values of the pull-up unit PUR0 and the pull-up transistors associated with the termination component 188 are set (or calibrated) to match the value of ZQ resistor 120 (e.g., RZQ).

The above-described calibration procedure determines the calibrated code signals CODEPU and CODEPD in a memory device 104. However, as discussed above, more than one memory device 104 can share the ZQ pin 116. Because multiple memory devices 104 can share a single ZQ pin 116, contention issues can occur in the event that multiple memory devices 104 perform ZQ calibration operations concurrently. For example, in the configuration of FIG. 1 where the memory devices 104 communicate with separate memory controllers 140, it may be possible for both memory controllers 140 to issue calibration commands to their respective memory devices 104 to concurrently perform respective calibration operations. To prevent contention issues from occurring on ZQ pin 116, each controller 190 can include an arbiter circuit 196 to resolve the contentions. For example, arbiter circuits 196 from multiple memory devices 104 can share a data bus (not shown) and use a token ring to prevent a memory device 104 from accessing the ZQ pin 116 until the arbiter circuit 196 of that memory device 104 has the token. Another method to prevent contention issues is to measure a potential of the ZQ pin 116 to see if another memory device 104 is accessing the ZQ pin 116 and if so, wait a predetermined time before attempting to connect to the ZQ pin 116. Because those skilled in the art understand arbiter circuits, for brevity, arbiter circuits will not be discussed further except as necessary to describe exemplary embodiments of the present technology and/or to describe non-conventional arbiter circuits and methods.

As discussed above, each package 108 can have more than one semiconductor component, such as, for example, a die. For example, in some embodiments, the package 108 can have 16 semiconductor components (e.g., dies), which can each have a memory device 104. The ZQ pads 112 of the 16 memory devices 104 can be connected to a common ZQ pin 116 on package 108 and arbiter circuits 196 can ensure that multiple memory devices 104 do not perform ZQ calibrations concurrently, as discussed above. However, because there are 16 memory devices 104, sequentially performing all 16 ZQ calibrations can get very long. Accordingly, in exemplary embodiments of the present technology, the memory devices 104 are configured such that at least some portions of the ZQ calibration process between multiple memory devices 104 can be performed in parallel.

For example, the calibration circuit 192 of FIG. 4A illustrates an embodiment of a calibration circuit that allows for calibrations to be performed in parallel by including a second pull-up unit PUR1 that can act as a reference calibration device for other memory devices 104. After completion of the pull-up unit calibration process, the calibrated code signal CODEPU is copied from pull-up unit PUR0 to pull-up unit PUR1. Of course, pull-up unit PUR1 can be connected to counter circuit CNTU such that both pull-up units PUR0 and PUR1 are updated with the intermediate code signal CODEPU at the same time during the calibration process. Once programmed with the calibrated code signal CODEPU, the impedance of pull-up unit PUR1 corresponds to RZQ. Because the impedance of pull-up unit PUR1 is known, the pull-up unit PUR1 can serve as a reference calibration device for purposes of calibrating pull-down units in other memory devices 104.

For example, as seen in FIG. 4A, the pull-up unit PUR1 can be connected to an internal pad 114 via a resistor. The internal pad 114 (also referred to herein as ZQI pad 114) can permit an interconnection between memory devices 104 (e.g., an inter-die connection). For example, in some embodiments, the ZQ pads of one or more memory devices (referred to herein as "secondary" memory devices and identified as SEC in FIG. 1) can connect to an internal reference calibration device (e.g., pull-up unit PUR1) of another memory device (referred to herein as "primary" memory device and identified as PRI in FIG. 1) via the ZQI pad 114 of the primary memory device. For example, as seen in FIG. 1, the ZQ pad 112 of secondary memory device 104(2) can be connected to the ZQI pad 114 of primary memory device 104(1), and the ZQ pad 112 of primary memory device 104(1) can be connected to the ZQ resistor 120. Similarly, the ZQ pad 112 of secondary memory devices 104(n) can be connected to the ZQI pad 114 of primary memory device 104(n−1), and the ZQ pad 112 of primary memory device 104(n−1) can be connected to the ZQ resistor 120. In the embodiment of FIG. 1, memory devices 104(1) and 104(n−1) are primary memory devices because they connect to an external reference calibration device (e.g., ZQ resistor 120) and memory devices 104(2) and 104(n) are secondary memory devices because they connect to an internal reference calibration device located in a primary memory device (e.g., pull-up unit PUR1). Because the calibration circuit 192 connects to the ZQ resistor 120, calibration circuit 192 is an example of a calibration circuit that can be used in a primary memory device such as memory device 104(2). In some embodiments, multiple secondary memory devices can connect to the ZQI pad and thus to the internal reference calibration device of the primary memory device. In some embodiments, while one or more primary memory devices can be connected to secondary memory devices, one or more other primary memory devices in the memory system may not have connected secondary devices.

When two or more primary memory devices are connected to an external reference calibration device (e.g., ZQ resistor 120) via their respective ZQ pads, the primary memory devices can use arbiter circuits to prevent contention issues at the pin for the external reference calibration device. Similarly, when the ZQ pads of two or more secondary memory devices are connected to an internal reference calibration device of a primary memory device via the ZQI pad of the primary memory device, the secondary memory devices can use arbiter circuits to prevent contention issues at the ZQI pad. The arbiter circuits in the primary and/or the secondary memory devices can be configured to use token ring and/or pad voltage type arbiter method to ensure that no more than one memory device is accessing the external reference calibration device or the internal reference calibration device, as appropriate. In addition, in some embodiment of the present technology, the controller 190, controller 140, and/or another controller can be programmed with a calibration sequence for the primary and/or second memory devices such that no more than one memory device is accessing the external reference calibration device and/or the internal reference calibration device, as appropriate.

Figure 5:
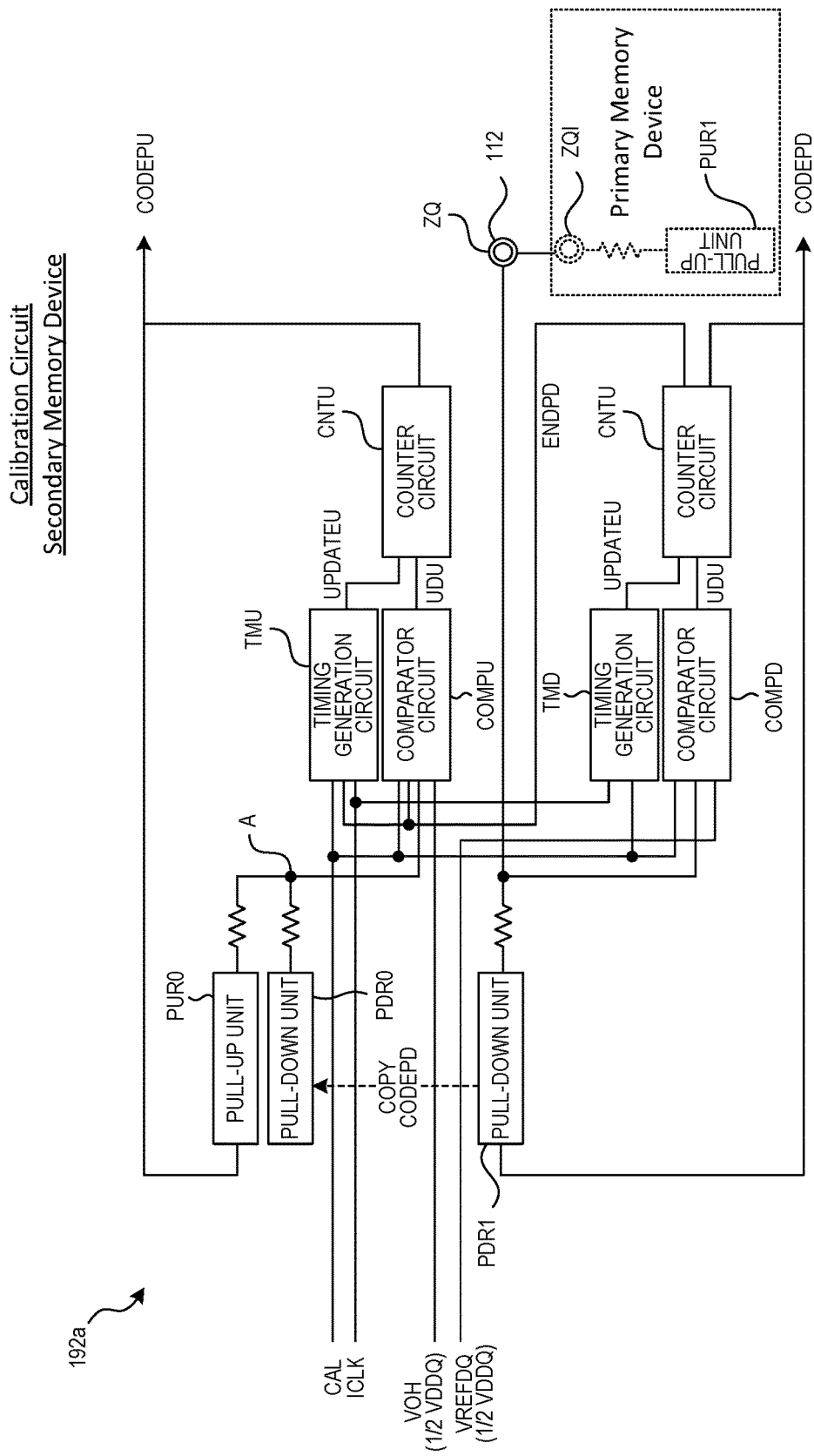
FIG. 5 is a schematic of an embodiment of a calibration circuit for a secondary memory device in accordance with the present disclosure.

As discussed above, FIG. 4A shows a calibration circuit for a primary memory device. In contrast, FIG. 5 illustrates an embodiment of a calibration circuit that can be used in a secondary memory device such as, for example, memory device 104(2). Other than the calibration process, the operations of the primary and secondary memory devices can be the same. With reference to FIGS. 4A and 5, in the calibration circuit 192a of the secondary memory device, instead of the ZQ pad 112 connecting to the ZQ resistor 120, the ZQ pad 112 is connected to programmable pull-up unit PUR1 (internal reference calibration device) in a primary memory device via the ZQI pad 114 of the primary memory device. The ZQI pad 114 connection in the primary memory device allows for the calibration circuit 192a on the secondary memory device to use the pull-up unit PUR1 in the primary memory device as the reference calibration device when performing a calibration process to determine the calibrated code signal CODEPD in the secondary memory device. As discussed above, the pull-up unit PUR1 in the primary memory device has been programmed with the calibrated code signal CODEPU of the primary memory device and thus has a known impedance value. That is, the previously programmed pull-up unit PUR1 of the primary memory device takes the place of the external ZQ resistor 120 as the reference calibration device when programming the secondary memory devices. For example, in the illustrated embodiment of FIG. 4A the impedance of pull-up unit PUR1, once programmed with the calibrated code signal, is RZQ and the reference potential VREFDQ for circuit 192a is ½ VDDQ because the impedance of the pull-up unit PUR1 in the primary memory device is RZQ. Of course, the impedance value of the previously calibrated pull-up unit PUR1 on the primary memory device can be different from the ZQ resistor 120. In such cases, when calibration circuit 192a performs the calibration process to determine the code signal CODEPD for the secondary memory device, appropriate adjustments to the reference potential VREFDQ in the calibration circuit 192a may be needed.

As seen in FIG. 5, the output node of the pull-down unit PDR1 of the calibration circuit 192a is connected to the comparator circuit COMPD and to the ZQ pad 112. The ZQ pad 112 in calibration circuit 192a is connected to ZQI pad 114 of a primary memory device. The comparator circuit COMPD compares, in response to the activation of the calibration command signal CAL, the potential at ZQI pad 114 (via ZQ pad 112) with the reference potential VREFDQ and generates an up-down signal UDD based on the result thereof. The value of reference optional VREFDQ is set to a value that will give the desired impedance for the pull-down unit. Because the impedance of PUR1 in the primary memory device is RZQ in this case, a VREFDQ of ½ VDDQ is used in order to get a desired impedance of RZQ for the pull-down units PD0-PD6. Once a calibrated code signal CODEPD is generated for the secondary memory device, the calibrated code signal CODEPU for the secondary memory device is generated in a manner similar to that described above with respect to calibration circuit 192.

Figure 4B:
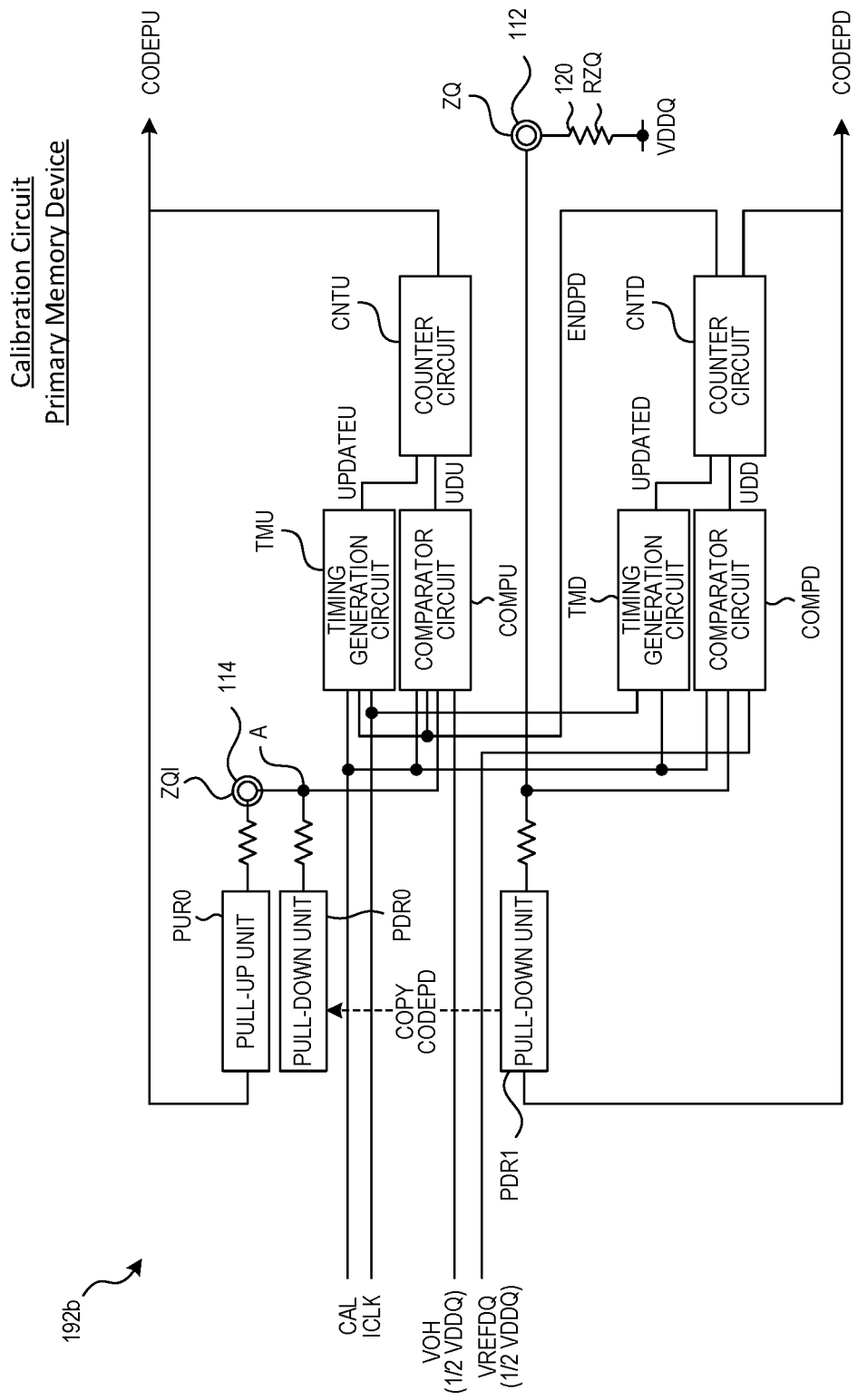
FIG. 4B is a schematic of another embodiment of a calibration circuit for a primary memory device in accordance with the present disclosure.

In the embodiment of FIG. 4A, a separate pull-up unit PUR1 was added to the calibration circuit 192 to act as the reference calibration device. However, pull-up unit PUR0, which is part of the calibration circuitry that generates the calibrated code signal CODEPU, also has an impedance of RZQ at the end of the calibration process. Accordingly, in some embodiments, pull-up unit PUR1 is not included in the calibration circuit of the primary memory device. Instead, after calibration, the pull-up unit PUR0 performs the function of the reference calibration device that is used by the secondary memory devices. For example, FIG. 4B illustrates an embodiment of a calibration circuit 192b in which pull-up unit PUR0 is used as the internal reference calibration device and pull-up unit PUR1 is eliminated. In this embodiment, the node A can include the ZQI pad 114 (or can be connected to the ZQI pad 114). However, before other secondary memory devices can connect to the pull-up unit PUR0 via the ZQI pad 114, PDR0 must be disabled to prevent interference. For example, PDR0 can be turned off or disconnected so that there is a high impedance between node A and the output of PDR0. Because there is one less copy operation with respect to code signal CODEPU (e.g., copy to pull-up unit PUR1) in this embodiment, there is less chance of a random error being inserted into the code signal CODEPU as compared to calibration circuit 192 of FIG. 4A.

In either configuration of the calibration circuit for a primary device (e.g., calibration circuit 192 or calibration 192b), one or more secondary memory devices can perform calibrations of their respective code signals CODEPD and CODEPU in parallel with one or more primary memory devices performing calibrations of their respective code signals CODEPD and CODEPU. Thus, as discussed in more detail below, exemplary embodiments of the present technology can reduce the calibration times of a memory system having multiple memory devices, for example, by approximately ⅓ to ½ (depending on the number of memory devices and the arrangement of primary and secondary memory devices), as compared to a memory system that does not perform parallel calibrations. This is because, in conventional memory components, all the memory devices in a memory system share the same external reference calibration device (e.g., ZQ resistor 120) and ZQ calibrations must be performed sequentially.

Figure 6:
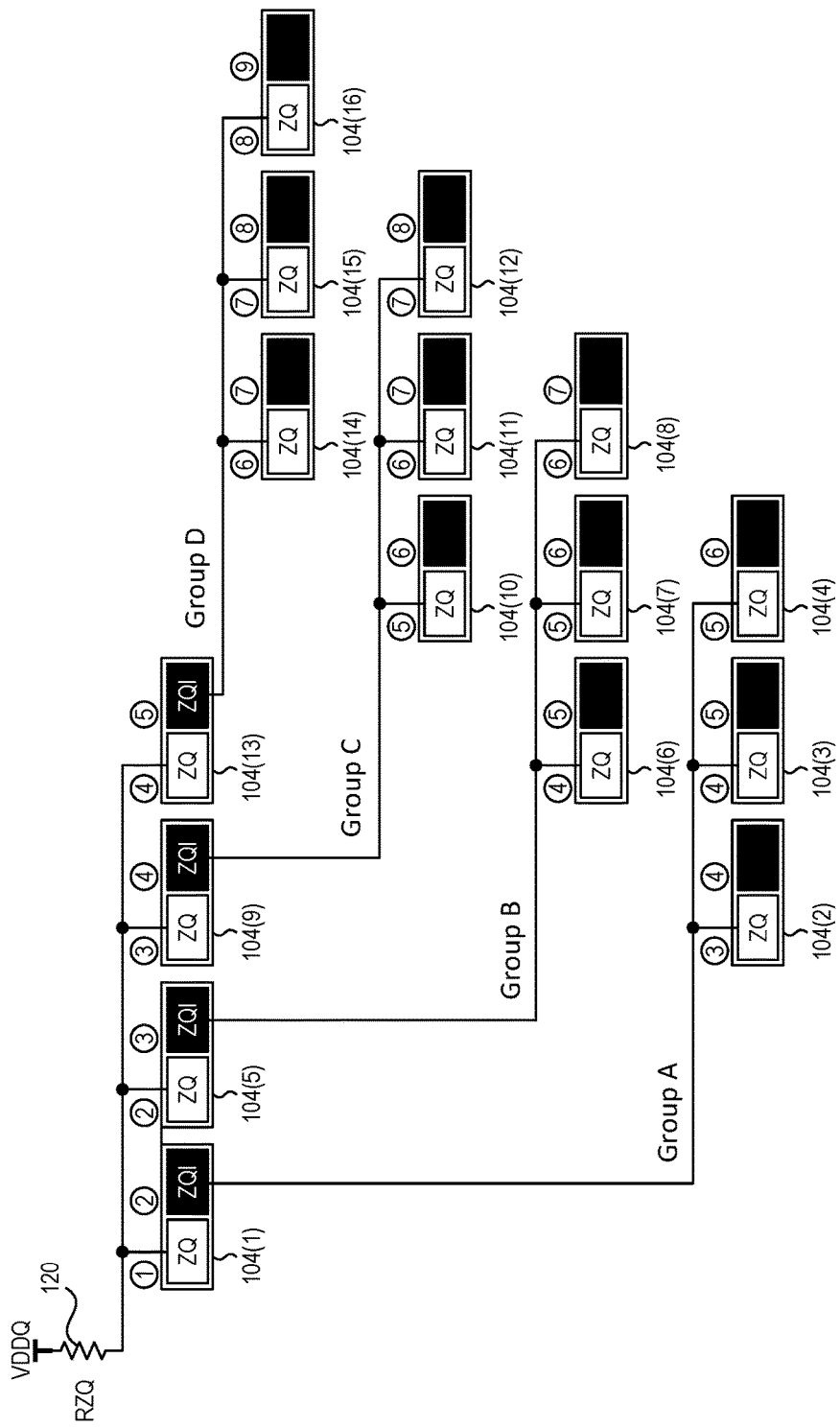
FIGS. 6 and 7 illustrate embodiments of memory device groupings and ZQ calibration sequences in accordance with the present disclosure.

FIG. 6 illustrates an exemplary embodiment that can reduce the calibration times by approximately ½ for a memory system with 16 memory devices 104. As shown in FIG. 6, the memory devices 104 are assembled into groups A-D having one or more memory devices 104. At least one memory device 104 in each group is configured as a primary memory device such that its ZQ pad 112 connects to the ZQ pin 116 of the package 108. The other memory devices 104 in each group are configured as secondary memory devices such that the respective ZQ pads 112 are connected to the ZQI pad 114 of the primary memory device. In the embodiment of FIG. 6, package 108 includes 16 memory devices 104(1) to 104(16) that are evenly arranged such that each of the four groups A-D has four memory devices 104. For clarity, the internal circuits for each of the memory devices 104 is not illustrated and only the connections with respect to the ZQ pad and the ZQI pad (for primary memory devices) are shown for each memory device. The primary memory devices for each group (e.g., memory device 104(1) in group A, 104(5) in group B, 104(9) in group C, and 104(13) in group D) are connected in parallel to the ZQ resistor 120 via the respective ZQ pads. The secondary memory devices of each group are connected in parallel to the ZQI pad of the primary memory device via the respective ZQ pads. For example, as shown in FIG. 6, the ZQ pads of secondary memory devices 104(2) to 104(4) are connected to the ZQI pad of primary memory device 104(1), the ZQ pads of secondary memory devices 104(6) to 104(8) are connected to the ZQI pad of primary memory device 104(5), the ZQ pads of secondary memory devices 104(10) to 104(12) are connected to the ZQI pad of primary memory device 104(9), and the ZQ pads of secondary memory devices 104(14) to 104(16) are connected to the ZQI pad of primary memory device 104(13).

As discussed above, ZQ calibration of a memory device includes a two-stage process that includes a programming a pull-down unit using the ZQ resistor to determine the calibrated code signal CODEPD and a programming of a pull-up unit to determine the calibrated code signal CODEPU using a pull-down unit programmed with the calibrated code signal CODEPD. Assuming each stage of the two-stage calibration process to be a calibration step, in a conventional memory system that has, for example, 16 memory devices in a package, a minimum of 17 calibration steps are needed to perform a sequential calibration of all the memory devices (assuming that, as a CODEPU calibration starts in one memory device, a CODEPD calibration starts in the next memory device). However, in the exemplary embodiment of FIG. 6, the total number of calibration steps can be reduced to 9 steps. In FIG. 6, two numbers are shown above each memory device indicating the calibration step corresponding to the two sages for each memory device. The step number above the ZQ terminal corresponds to the first calibration stage for each memory device and the number above the ZQI terminal (primary memory device) or the blank box (secondary memory device) corresponds to the second calibration stage for each memory device.

Table 1 summarizes the steps in the ZQ calibration process for calibrating the code signals CODEPD and CODEPU for each of the 16 memory devices 104. With reference to FIG. 6 and Table 1, in a first step of the ZQ calibration process for the package 108, the memory device 104(1) calibrates its code signal CODEPD using the ZQ resistor 120 via its ZQ pad 112, as discussed above. In a second step of the ZQ calibration process, the memory device 104(1) calibrates its code signal CODEPU and the memory device 104(5) concurrently calibrates its code signal CODEPD using the ZQ resistor 120 via its ZQ pad 112. In a third step of the ZQ calibration process, the memory device 104(5) calibrates its code signal CODEPU and memory device 104(9) concurrently calibrates its code signal CODEPD using the ZQ resistor 120 via its ZQ pad 112. In addition, unlike a conventional system, during the third step of the ZQ calibration process, the memory device 104(2), in parallel with the calibration of the code signal CODEPD in memory device 104(9), performs a calibration of its code signal CODEPD using the now programmed pull-up unit of the memory device 104(1) via a connection between its ZQ pad 112 and the ZQI pad 114 of memory device 104(1). Thus, unlike a conventional system, the memory device 104(2) need not wait on the ZQ resistor to free up before starting its two-stage ZQ calibration because the programmed pull-up unit of the memory device 104(1) acts as a reference calibration device. In step 4, memory devices 104(2) and 104(9) perform CODEPU calibrations, memory device 104(13) calibrates its code signal CODEPD using the ZQ resistor 120 via its ZQ pad 112, and memory devices 104(3) and 104(6) calibrate their respective code signals CODEPD using the now programmed pull-up units of the memory devices 104(1) and 104(5) via the connections between their ZQ pads 112 and the ZQI pads 114 of memory device 104(1) and 104(5), respectively, as shown in FIG. 6. In step 5, memory devices 104(3), 104(6), and 104(13) perform CODEPU calibrations and memory devices 104(4), 104(7), and 104(10) calibrate their respective code signals CODEPD using the now programmed pull-up units of the memory devices 104(1), 104(5), and 104(9) via the connections between their ZQ pads 112 and the ZQI pads 114 of memory device 104(1), 104(5), and 104(9), respectively. Because this embodiment only has four primary memory devices, the ZQ resistor 120 is not accessed by the memory devices 104 starting at step 5. Based on FIG. 6 and Table 1, those skilled in the art will understand the calibration sequence for the remaining steps and thus, for brevity, steps 6 to 9 are not discussed. Of course, the sequence order in which the primary devices access the external reference calibration device is not limited to the that shown in Table 1 and other appropriate sequences can be used. Similarly, the sequence order in which the secondary memory devices access the respective internal reference calibration device is not limited to that shown in Table 1 and other appropriate sequences can be used.

TABLE 1

| STEP | Determination of code signal CODEPD via external reference calibration device | Determination of code signal CODEPU | Determination of code signal CODEPD via internal reference calibration device of primary memory device |
|---|---|---|---|
| 1 | 104(1) | | |
| 2 | 104(5) | 104(1) | |
| 3 | 104(9) | 104(5) | 104(2)/(1) |
| 4 | 104(13) | 104(2), 104(9) | 104(3)/(1), 104(6)/(5) |
| 5 | | 104(3), 104(6), 104(13) | 104(4)/(1), 104(7)/(5), 104(10)/(9) |
| 6 | | 104(4), 104(7), 104(10) | 104(8)/(5), 104(11)/(9), 104(14)/(13) |
| 7 | | 104(8), 104(11), 104(14) | 104(12)/(9), 104(15)/(13) |
| 8 | | 104(12), 104(15) | 104(16)/(13) |
| 9 | | 104(16) | |

In the exemplary embodiment of FIG. 6, the groups A-D have an equal number of memory devices 104. By equalizing the grouping, the manufacturing process with respect to the interconnections between ZQ pads and ZQI pads is simpler than if each grouping has a different number of memory devices. However, as seen in Table 1, in steps 5-9 there is no memory device that accesses the ZQ resistor 120 for CODEPD calibration. Thus, further reduction of the ZQ calibration time can be achieved if equalizing the number of memory devices in each of groups is not required.

Figure 7:
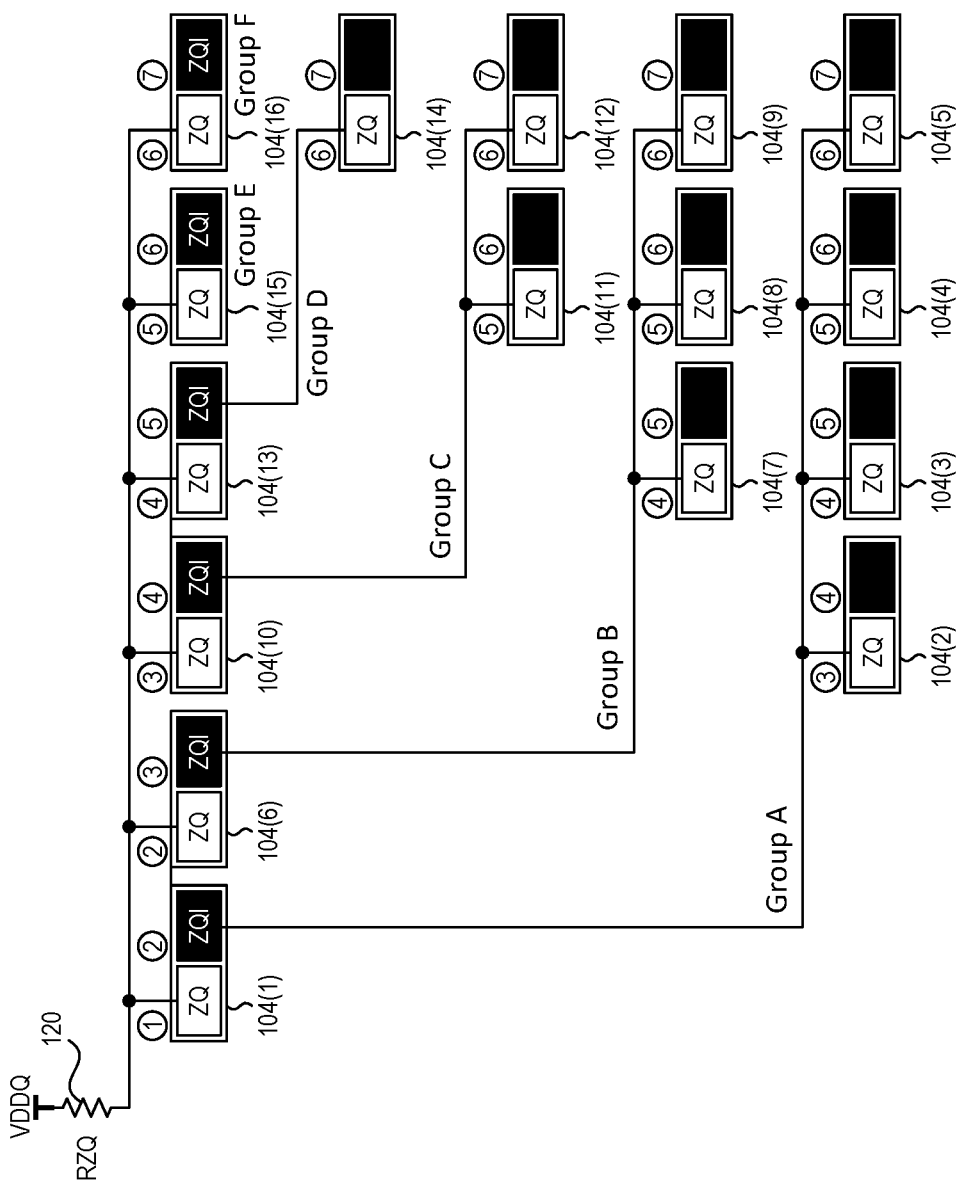

FIG. 7 illustrates another exemplary embodiment of the present invention. As shown in FIG. 7, the memory devices in package 108 are arranged into 6 groups A-F. Group A has five memory devices, group B has four memory devices, group C has three memory devices, group D has two memory devices, and groups E and F only have one memory device. In FIG. 7, similar to the embodiment of FIG. 6, two numbers are shown above each memory device indicating the calibration step corresponding to the two stages for each memory device. The step number above the ZQ terminal corresponds to the first calibration stage for each memory device and the number above the ZQI terminal (primary memory device) or the blank box (secondary memory device) corresponds to the second calibration stage for each memory device.

By arranging the memory devices in groups A-F as shown in FIG. 7, the number of ZQ calibration steps can be reduced to 7. For brevity, the ZQ calibration steps are not discussed because the calibration sequence will be understandable to one skilled in the art based on the above description with respect to FIG. 6, the illustrated embodiment in FIG. 7, and the summary of the calibration steps in Table 2. Of course, the sequence order in which the primary devices access the external reference calibration device is not limited to that shown in Table 2 and other appropriate sequences can be used. Similarly, the sequence order in which the secondary memory devices access the respective internal reference calibration device is not limited to that shown in Table 2 and other appropriate sequences can be used.

TABLE 2

| STEP | Determination of code signal CODEPD via external reference calibration device | Determination of code signal CODEPU | Determination of code signal CODEPD via internal reference calibration device of primary memory device |
|---|---|---|---|
| 1 | 104(1) | | |
| 2 | 104(6) | 104(1) | |
| 3 | 104(10) | 104(6) | 104(2)/(1) |
| 4 | 104(13) | 104(2), 104(10) | 104(3)/(1), 104(7)/(6) |
| 5 | 104(15) | 104(3), 104(7), 104(13) | 104(4)/(1), 104(8)/(6), 104(11)/(10) |
| 6 | 104(16) | 104(4), 104(8), 104(11), 104(15) | 104(5)/(1), 104(9)/(6), 104(12)/(10), 104(14)/(13) |
| 7 | | 104(5), 104(9), 104(12), 104(14), 104(16) | |

The exemplary ZQ calibration sequences in FIGS. 6 and 7 are directed to a memory system with 16 memory devices. However, those skilled in the art understand that the techniques used in the exemplary embodiments of FIGS. 6 and 7 can be applied to memory systems having 2 or more memory devices, including memory systems having more than 16 memory devices. By arranging the memory devices 104 into groups in which one or more memory devices performs parallel calibrations using an internal calibration device of another memory device as a reference, reduction in the ZQ calibration times can be achieved.

Figure 8:
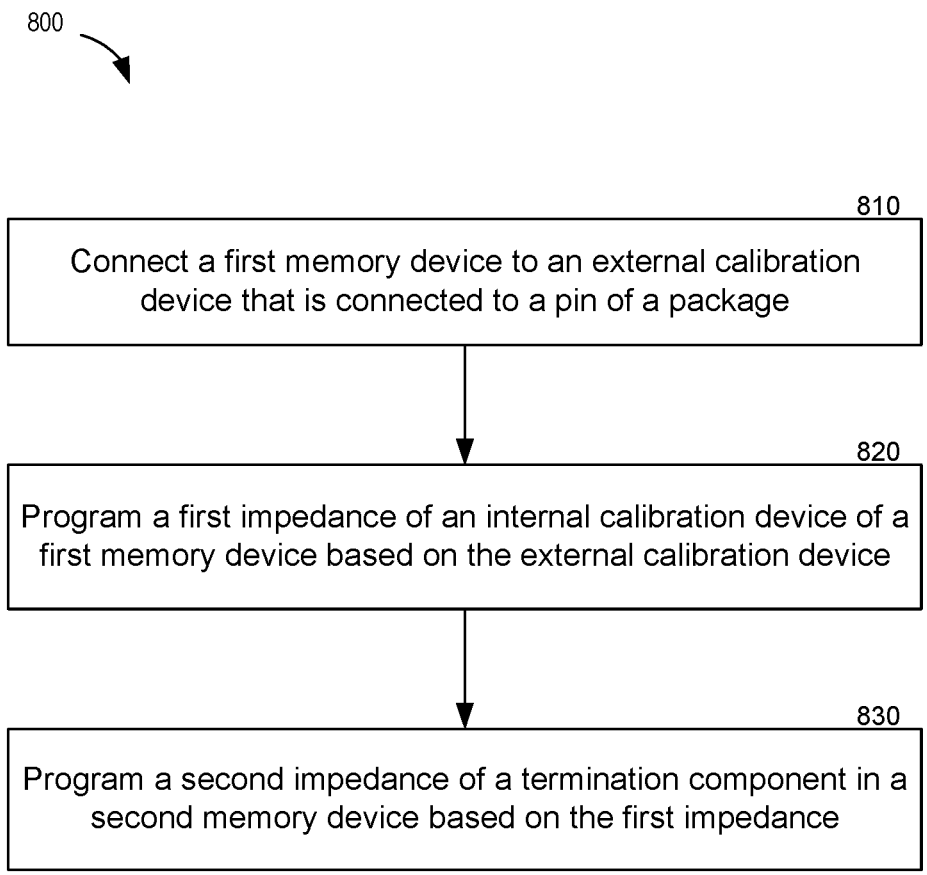
FIG. 8 is a flow diagram for an embodiment of a calibration procedure is accordance with the present disclosure.

FIG. 8 is a flow diagram illustrating example method 800 for managing ZQ calibration in memory devices. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the controller 190, controller 140 and/or another controller. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 810, the processing device (e.g., controller 190, controller 140 and/or another controller) connects a first memory device to an external calibration device that is connected to a pin of a package. For example, as discussed above and shown in FIGS. 1, 4A and 4B, the ZQ pad 112 of the primary memory devices can connect to the ZQ resistor 120 via pin 116 of the package 108.

At block 820, the processing device (e.g., controller 190, controller 140 and/or another controller) programs a first impedance of an internal calibration device of a first memory device based on the external calibration device. For example, as discussed above and shown in FIGS. 4A and 4B, after determining the calibrated code signal CODEPU, an internal calibration device (e.g., pull-up unit PUR1 (FIG. 4A) or PUR0 (FIG. 4B)) is calibrated by the calibration circuit in the primary memory devices.

At block 830, the processing device (e.g., controller 190, controller 140 and/or another controller) programs a second impedance of a termination component in a second memory device based on the first impedance. For example, as discussed above and shown in FIGS. 1 and 5, the calibration circuit 192a in the secondary memory device determines the calibrated code signal CODEPD based on the internal calibration device in the primary memory device. The calibration circuit 192a also determines the calibrated code signal CODEPU for the secondary memory device and then the calibrated code signals CODEPD and CODEPU can be used to program the terminations in termination component 188.

In the embodiments described above, the calibrated code signal CODEPD of a memory device is determined first and then the calibrated code signal CODEPU of the memory device is determined based on the calibrated code signal CODEPD. However, those skilled in the art understand that the calibrated code signal CODEPU can be determined first and then the calibrated code signal CODEPD can be determined based on the calibrated code signal CODEPU. In addition, in the embodiments described above, the internal reference calibration device is a pull-up unit. However, those skilled in the art understand that the internal reference calibration device can be a pull-down unit.

In the above exemplary embodiments, for clarity, the primary memory device and the secondary memory device are described as having different structures for the respective calibration circuits, and the secondary memory devices are shown not having ZQI pads. However, those skilled in the art understand that all the memory devices can have the same structures and/or structures in which the calibration functions corresponding to the primary and secondary memory devices overlap at least in part. For example, all memory devices can be configured to have ZQ pads that can connect to either the external reference calibration device via the pin of the package or the internal reference calibration device of another memory device, and/or all memory devices can be configured to have ZQI pads that allow access to internal reference calibration devices by other memory devices. During calibration operations, the execution of the different functions between the primary memory devices and the secondary memory devices can be achieved by appropriate circuitry such as, for example, switching circuits. For example, with respect to the function of selecting an external or internal calibration device, a switch circuit (not shown) can be inserted in the calibration circuit such that the ZQ pad 112 can be selectively connected to either the ZQ resistor 120 via pin 116 (e.g., to perform the function of calibration circuit 192) or the ZQI pad 114 of a primary memory device (e.g., to perform the function of calibration circuit 192a). Thus, in some embodiments, the structures of the memory devices 104 can be identical and the functions of the primary memory device and the secondary memory device can be accomplished by appropriately programming the controller 190, controller 140, and/or another controller.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, although steps are presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," "having," and "with" are used throughout to mean including at least the recited feature(s) such that any greater number of the same feature and/or additional types of other features are not precluded.

The processing device (e.g., controller 190, controller 140 and/or another controller) represents one or more general-purpose processing devices such as a microprocessor, a central processing unit, or the like. More particularly, the processing device can be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device (e.g., controller 190, controller 140 and/or another controller) can also be one or more special-purpose processing devices such as an application specific integrated circuit (ASIC), a field programmable gate array (FPGA), a digital signal processor (DSP), network processor, or the like. The processing device (e.g., controller 190, controller 140 and/or another controller) is configured to execute instructions for performing the operations and steps discussed herein.

The machine-readable storage medium (also known as a computer-readable medium) on which is stored one or more sets of instructions or software embodying any one or more of the methodologies or functions described herein. The machine-readable storage medium can be, for example, memory system 100 or another memory device. The term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can comprise a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

It will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. An apparatus, comprising:
a package having a pin configured to be connected to an external calibration device;
a first memory device disposed in the package, including:
a first pad for selective connection to the external calibration device via the pin,
an internal calibration device having a first impedance that is programmable, and
a second pad connected to the internal calibration device;
a second memory device disposed in the package, the second memory device including a third pad for selective connection to the second pad of the first memory device; and
a processing device operatively coupled to the first memory device and the second memory device, to:
program the first impedance based on the external calibration device, and
program a second impedance of a termination component in the second memory device based on the first impedance.

2. The apparatus of claim 1, further comprising:
a third memory device disposed in the package, the third memory device including a fourth pad for selective connection to the external calibration device via the pin,
wherein the processing device is further configured to:
determine a first calibration code signal for programming a third impedance of a second termination component of the third memory device, and
determine a second calibration code signal for programming the second impedance, and
wherein the determination of the first calibration code signal and the determination of the second calibration code signal are done in parallel.

3. The apparatus of claim 1, wherein the programming of the first impedance includes:
determining a first calibration code signal for a second termination component in the first memory device using the external calibration device,
determining a second calibration code signal for the second termination component using the first calibration code signal, and
using the second calibration code signal to program the first impedance.

4. The apparatus of claim 1, wherein the second memory device is one of a plurality of second memory devices disposed in the package, and
wherein each respective third pad of the plurality of second memory devices is configured for selective connection to the second pad of the first memory device.

5. The apparatus of claim 1, wherein the first memory device is one of a plurality of first memory devices disposed in the package and the second memory device is one of a plurality of second memory devices disposed in the package, wherein, for each first memory device of the plurality of first memory devices, a portion of the plurality of second memory devices is configured to selectively connect to the second pad of the respective first memory device via the third pad of respective second memory device.

6. The apparatus of claim 5, wherein each of the first memory devices includes a first arbiter circuit to ensure no more than one first memory device is connected to the external calibration device and each of the second memory devices includes a second arbiter circuit to ensure no more than one second memory device is connected to the internal calibration device of the respective first memory device.

7. The apparatus of claim 5, wherein a number of first memory devices is in a range of 1 to 6 and, for each portion of second memory devices, a number of second memory devices is up to 4.

8. The apparatus of claim 5, wherein a number of first memory devices is 4 and, a number of second memory devices in each portion of second memory devices is 3.

9. A method, comprising:

connecting a first memory device to an external calibration device that is connected to a pin of a package;

programming a first impedance of an internal calibration device of a first memory device based on the external calibration device, and programming a second impedance of a termination component in a second memory device based on the first impedance.

10. The method of claim 9, further comprising:

connecting a third memory device to the external calibration device via the pin;

determining a first calibration code signal for programming a third impedance of a termination component of the third memory device; and determining a second calibration code signal for programming the second impedance, wherein the determining of the first calibration code signal and the determining of the second calibration code signal are done in parallel.

11. The method of claim 9, wherein the programming of the first impedance includes:

determining a first calibration code signal for a second termination component in the first memory device using the external calibration device, determining a second calibration code signal for the second termination component using the first calibration code signal, and using the second calibration code signal to program the first impedance.

12. The method of claim 9, wherein the second memory device is one of a plurality of second memory devices that is selectively connected to the first memory device.

13. The method of claim 9, wherein the first memory device is one of a plurality of first memory devices disposed in the package and the second memory device is one of a plurality of second memory devices disposed in the package, wherein, for each first memory device of the plurality of first memory devices, a portion of the plurality of second memory devices is configured to selectively connect to the respective first memory device.

14. The method of claim 13, further comprising:

controlling access of each of the first memory devices to the external calibration device to ensure no more than one first memory device is connected to the external calibration device; and controlling access of each of the second memory devices to the respective first memory device to ensure no more than one second memory device is connected to the internal calibration device of the respective first memory device.

15. The method of claim 13, wherein a number of first memory devices is in a range of 1 to 6 and, for each portion of second memory devices, a number of second memory devices is up to 4.

16. The method of claim 13, wherein a number of first memory devices is 4 and, a number of second memory devices in each portion of second memory devices is 3.

17. A non-transitory computer-readable storage medium comprising instructions that, when executed by a processing device, cause the processing device to:

operatively connect a first memory device to an external calibration device that is connected to a pin of a package;

program a first impedance of an internal calibration device of a first memory device based on the external calibration device, and program a second impedance of a termination component in a second memory device based on the first impedance.

18. The non-transitory computer-readable storage medium of claim 17, further comprising instructions that, when executed by a processing device, cause the processing device to:

operatively connect a third memory device to the external calibration device via the pin;

determine a first calibration code signal for programming a third impedance of a termination component of the third memory device; and determine a second calibration code signal for programming the second impedance, wherein the determining of the first calibration code signal and the determining of the second calibration code signal are done in parallel.

19. The non-transitory computer-readable storage medium of claim 17, wherein the programming of the first impedance includes:

determining a first calibration code signal for a second termination component in the first memory device using the external calibration device, determining a second calibration code signal for the second termination component using the first calibration code signal, and using the second calibration code signal to program the first impedance.

20. The non-transitory computer-readable storage medium of claim 17, wherein the second memory device is one of a plurality of second memory devices that is selectively connected to the first memory device.

21. The non-transitory computer-readable storage medium of claim 17, wherein the first memory device is one of a plurality of first memory devices disposed in the package and the second memory device is one of a plurality of second memory devices disposed in the package, and wherein, for each first memory device of the plurality of first memory devices, a portion of the plurality of second memory devices is configured to selectively connect to the respective first memory device.

22. The non-transitory computer-readable storage medium of claim 17, further comprising instructions that, when executed by a processing device, cause the processing device to:
- control access of each of the first memory devices to the external calibration device to ensure no more than one first memory device is connected to the external calibration device; and
- control access of each of the second memory devices to the respective first memory device to ensure no more than one second memory device is connected to the internal calibration device of the respective first memory device.

23. The non-transitory computer-readable storage medium of claim 22, wherein a number of first memory devices is in a range of 1 to 6 and, for each portion of second memory devices, a number of second memory devices is up to 4.

24. The non-transitory computer-readable storage medium of claim 22, wherein a number of first memory devices is 4 and, a number of second memory devices in each portion of second memory devices is 3.

* * * * *